(12) United States Patent
Park et al.

(10) Patent No.: US 9,466,336 B2
(45) Date of Patent: Oct. 11, 2016

(54) SEMICONDUCTOR APPARATUS AND SYSTEM CAPABLE OF REDUCING PEAK CURRENT IN TRANSMITTING SIGNALS

(71) Applicant: SK hynix Inc., Icheon-si Gyeonggi-do (KR)

(72) Inventors: Min Su Park, Icheon-si (KR); Young Jun Ku, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 150 days.

(21) Appl. No.: 14/607,580

(22) Filed: Jan. 28, 2015

(65) Prior Publication Data

US 2016/0104517 A1 Apr. 14, 2016

(30) Foreign Application Priority Data

Oct. 8, 2014 (KR) .................. 10-2014-0135707

(51) Int. Cl.
| | |
|---|---|
| *H03K 17/16* | (2006.01) |
| *G11C 5/06* | (2006.01) |
| *H03K 19/0175* | (2006.01) |
| *G11C 5/04* | (2006.01) |
| *G11C 7/10* | (2006.01) |

(52) U.S. Cl.
CPC ............... *G11C 5/063* (2013.01); *G11C 5/04* (2013.01); *G11C 7/106* (2013.01); *G11C 7/1048* (2013.01); *H03K 19/017509* (2013.01); *G11C 7/1006* (2013.01)

(58) Field of Classification Search
CPC ...... H03K 5/01; H03K 5/1252; H03K 19/00; H03K 3/013
USPC ............. 326/21, 26–27, 30, 62–63, 112–113
See application file for complete search history.

(56) References Cited

U.S. PATENT DOCUMENTS

| | | | | |
|---|---|---|---|---|
| 6,288,971 | B1* | 9/2001 | Kim | G11C 7/1066 365/193 |
| 6,940,321 | B2* | 9/2005 | Heo | G11C 7/1051 327/112 |
| 7,089,439 | B1* | 8/2006 | Abdollahi-Alibeik | G06F 1/10 326/93 |
| 7,952,948 | B2* | 5/2011 | Lee | G11C 7/1048 326/63 |
| 8,035,977 | B1* | 10/2011 | Ho | G06F 1/189 361/760 |
| 8,653,853 | B1* | 2/2014 | Shumarayev | H03K 19/0175 326/30 |
| 2003/0117301 | A1* | 6/2003 | Savaria | H03K 19/00346 341/55 |
| 2003/0184342 | A1* | 10/2003 | Mueller | G11C 7/1048 326/86 |
| 2008/0191734 | A1* | 8/2008 | Yang | H03K 19/0005 326/30 |

FOREIGN PATENT DOCUMENTS

KR 101096185 B1 12/2011

* cited by examiner

*Primary Examiner* — Jason M Crawford
(74) *Attorney, Agent, or Firm* — William Park & Associates Ltd.

(57) ABSTRACT

A semiconductor apparatus includes a first output control unit and a second output control unit. The first output control unit includes a plurality of non-inversion pipes and a plurality of inversion pipes. The non-inversion pipes non-invert input signals and output the non-inverted input signals to a signal transmission line as transmission signal, and the inversion pipes invert input signals and output the inverted input signals to the signal transmission line as the transmission signals. The second output control unit includes a plurality of non-inversion pipes and a plurality of inversion pipes. The non-inversion pipes non-invert the transmission signals and output the non-inverted transmission signals, and the inversion pipes invert the transmission signals and output the inverted transmission signals.

20 Claims, 6 Drawing Sheets

SEMICONDUCTOR APPARATUS AND SYSTEM CAPABLE OF REDUCING PEAK CURRENT IN TRANSMITTING SIGNALS

CROSS-REFERENCES TO RELATED APPLICATION

The present application claims priority under 35 U.S.C. §119(a) to Korean application number 10-2014-0135707 filed on Oct. 8, 2014 in the Korean Intellectual Property Office, which is incorporated herein by reference in its entirety.

BACKGROUND

1. Technical Field

Embodiments of the present invention generally relate to a semiconductor apparatus, and more particularly, in one or more embodiments, to a semiconductor apparatus and a system capable of reducing peak current during signal transmission.

2. Related Art

In general, a semiconductor apparatus includes a plurality of signal transmission lines for transmitting signals, the length of which may vary depending on the signal line configuration. Where electrical signals are transmitted via long signal transmission lines, attenuation of the signal strength during transmission may cause errors when a receiver circuit decodes the transmitted signal. The attenuation may become more serious when low-voltage signals are being transmitted via the long signal transmission lines.

The semiconductor apparatus may include a repeater on the signal transmission line to compensate for the attenuation. The repeater may amplify the signal being transmitted via the signal transmission line so that the receiver circuit can recognize the signal without error.

FIG. 1 is a circuit diagram illustrating a known signal transmission circuit 10. Referring to FIG. 1, the signal transmission circuit 10 comprises a signal transmission line 11, and first and second repeaters 12 and 13. The first and second repeaters 12 and 13 are separately disposed with uniform interval through the signal transmission line 11. For example, the first repeater 12 is disposed at one-third of the signal transmission line 11, and the second repeater 13 is disposed at two-thirds of the signal transmission line 11.

When an input signal IN is inputted with sequential logic levels of "L" (logic low), "L", "L", and "L", a logic level of the signal transmission line 11 between the first and second repeaters 12 and 13 does not change. Therefore, the signal transmission circuit 10 consumes small power, a peak current therein does not occur. However, when the input signal IN in inputted with toggling logic levels such as "L", "H" (logic high), "L" and "H" in sequence, the logic level of the signal transmission line 11 between the first and second repeaters 12 and 13 keeps toggling between the logic levels. Therefore, the signal transmission circuit 10 consumes great power, and the peak current therein does occur.

SUMMARY

In an embodiment of the present invention, a semiconductor apparatus or a system may include an output control unit comprising a non-inversion pipe and an inversion pipe. The output control unit may be encoding and decoding data so that the amount of current consumed during signal transmission is optimized.

In an embodiment of the present invention, a semiconductor apparatus may include a first output control unit comprising a plurality of non-inversion pipes configured to non-invert input signals and output the non-inverted input signals to a signal transmission line as transmission signals, and a plurality of inversion pipes configured to invert input signals and output the inverted input signals to the signal transmission line as the transmission signals; and a second output control unit comprising a plurality of non-inversion pipes configured to non-invert the transmission signals and output the non-inverted transmission signals, and a plurality of inversion pipes configured to invert the transmission signals and output the inverted transmission signals.

In an embodiment of the present invention, a system may include a stacked die including a first output control unit configured to output transmission data by aligning data outputted from a memory core; and a base die including a second output control unit configured to receive the transmission data through a through-via, and to output an output data by aligning the transmission data. The first output control unit may include a plurality of non-inversion pipes configured to non-invert and output a part of data, which is outputted from the memory core, to a signal transmission line, and a plurality of inversion pipes configured to invert and output the other part of data, which is outputted from the memory core, to the signal transmission line. The second output control unit may include a plurality of non-inversion pipes configured to non-invert and output a part of the transmission data, and a plurality of inversion pipes configured to invert and output the other part of the transmission data.

BRIEF DESCRIPTION OF THE DRAWINGS

Features, aspects and embodiments are described in conjunction with the attached drawings, in which.

DETAILED DESCRIPTION

Figure 2:
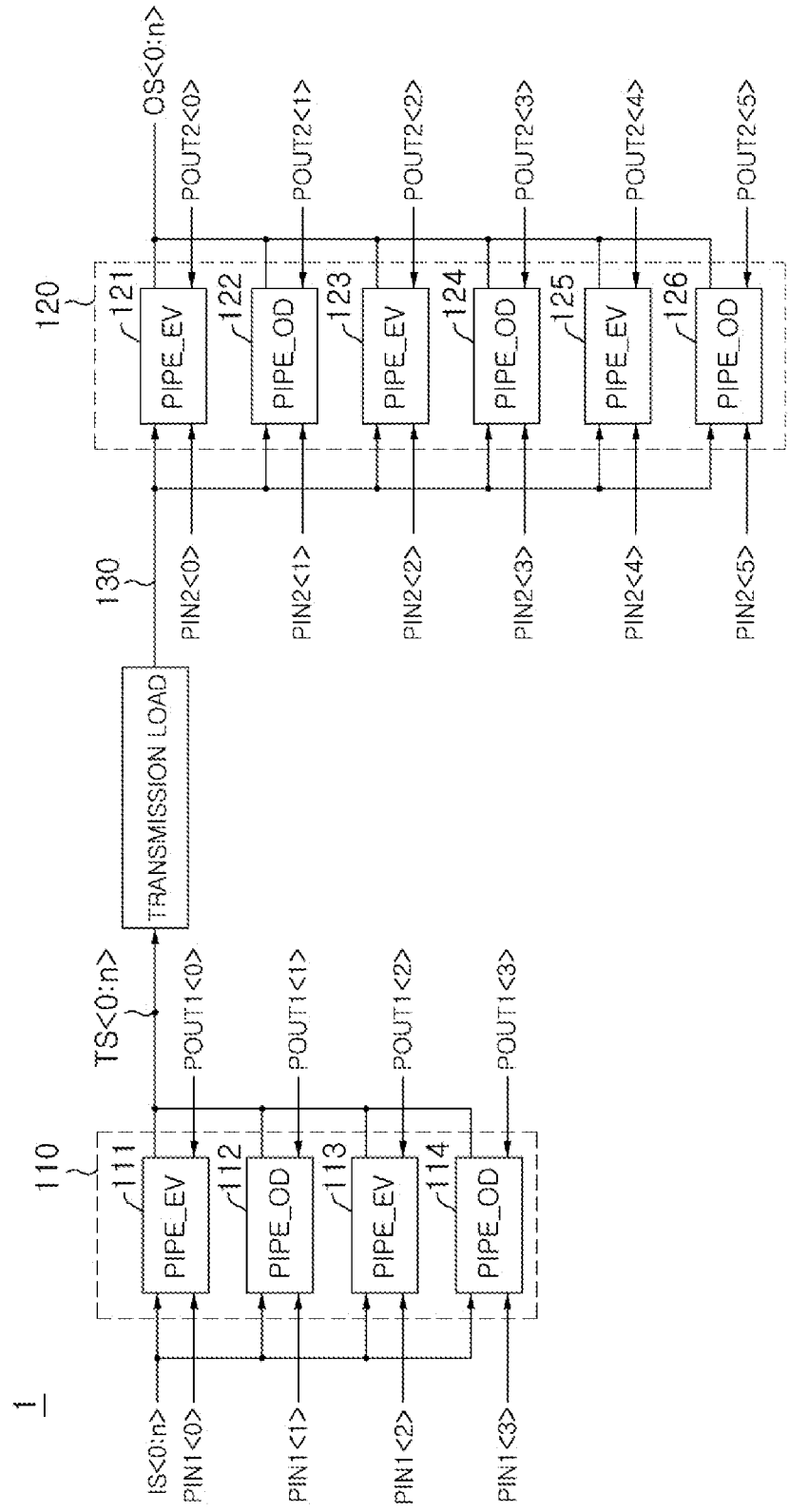
FIG. 2 is a block diagram illustrating a semiconductor apparatus in accordance with an embodiment of the present disclosure.

Referring to FIG. 2, the semiconductor apparatus 1 may include a first output control unit 110, and a second output control unit 120.

The first output control unit 110 may receive a plurality of input signals IS<0:n> (e.g., n is an integer equal to or greater than two). The first and second output control units 110 and 120 may be coupled to each other through a signal transmission line 130. The second output control unit 120 may output a plurality of output signals OS<0:n> in response to the signals transmitted though the signal transmission line 130. The first output control unit 110 may generate a plurality of transmission signals TS<0:n>, for example, by aligning the plurality of input signals IS<0:n>. The first output control unit 110 may transmit the plurality of transmission signals TS<0:n> to the second output control unit 120 through the signal transmission line 130. The second output control unit 120 may receive the plurality of transmission signals TS<0:n> transmitted through the signal transmission line 130. The second output control unit 120 may generate the plurality of output signals OS<0:n>, for example, by aligning the plurality of transmission signals TS<0:n>. The signal transmission line 130 may include transmission load. For example, at least a portion of the signal transmission line 130 may behave as an electrical load. The first output control unit 110 may generate a part of the plurality of transmission signals TS<0:n> by non-inverting a part of the plurality of input signals IS<0:n>, and may generate the other part of the plurality of transmission signals TS<0:n> by inverting the other part of the plurality of input signals IS<0:n>. The second output control unit 120 may generate a part of the plurality of output signals OS<0:n> by non-inverting a part of the plurality of transmission signals TS<0:n>, and may generate the other part of the plurality of output signals OS<0:n> by inverting the other part of the plurality of transmission signals TS<0:n>. In an embodiment of the present invention, the part of the plurality of output signals OS<0:n> may be generated by the second output control unit 120 through the non-inversion of the part of the plurality of transmission signals TS<0:n>, which is generated through the non-inversion of the part of the plurality of input signals IS<0:n> by the first output control unit 110. In an embodiment of the present invention, the other part of the plurality of output signals OS<0:n> may be generated by the second output control unit 120 through the inversion of the other part of the plurality of transmission signals TS<0:n>, which is generated through the inversion of the other part of the plurality of input signals IS<0:n> by the first output control unit 110.

The first output control unit 110 may store the plurality of input signals IS<0:n>, which are serially inputted, and may serially output the plurality of transmission signals TS<0:n>. For example, each of the plurality of input signals IS<0:n>, which has been serially inputted, may be stored in parallel at the first output control unit 110 by using a plurality of pipes. The first output control unit 110 may generate the plurality of transmission signals TS<0:n>, logic levels of which are different from the plurality of input signals IS<0:n>. The first output control unit 110 may include a plurality of non-inversion pipes 111 and 113, and a plurality of inversion pipes 112 and 114. The plurality of non-inversion pipes 111 and 113 may generate the plurality of transmission signals TS<0:n> by non-inverting the plurality of received input signals IS<0:n>, and the plurality of inversion pipes 112 and 114 may generate the plurality of transmission signals TS<0:n> by inverting the plurality of received input signals IS<0:n>. The plurality of transmission signals TS<0:n>, which are outputted from the plurality of non-inversion pipes 111 and 113, may have the substantially same logic level as the plurality of input signals IS<0:n>, which the plurality of non-inversion pipes 111 and 113 receives. The plurality of transmission signals TS<0:n>, which are outputted from the plurality of inversion pipes 112 and 114, may have the substantially opposite logic level of the plurality of input signals IS<0:n>, which the plurality of inversion pipes 112 and 114 receives. The first output control unit 110 may receive the plurality of input signals IS<0:n> in response to a plurality of first input control signals PIN1<0:3>, and may output the plurality of transmission signals TS<0:n> in response to a plurality of first output control signals POUT1<0:3>. The plurality of non-inversion pipes 111 and 113 and the plurality of inversion pipes 112 and 114 may sequentially and alternately receive the plurality of input signals IS<0:n>. Also, the plurality of non-inversion pipes 111 and 113 and the plurality of inversion pipes 112 and 114 may sequentially and alternately output the plurality of transmission signals TS<0:n>. For example, each of the non-inversion and inversion pipes 111 to 114 may alternately output each of the plurality of transmission signals TS<0:n> in response to respective first input control signal PIN1<0:3> to sequentially input the plurality of transmission signals TS<0:n> to the signal transmission line 130.

The second output control unit 120 may store the plurality of transmission signals TS<0:n>, which are serially inputted through the signal transmission line 130, and may serially output the plurality of output signals OS<0:n>. For example, each of the plurality of transmission signals TS<0:n>, which has been serially inputted, may be stored in parallel at the second output control unit 120 by using a plurality of pipes. The second output control unit 120 may generate the plurality of output signals OS<0:n>, logic levels of which are the same as the plurality of input signals IS<0:n>, from the plurality of transmission signals TS<0:n>. The second output control unit 120 may include a plurality of non-inversion pipes 121, 123, and 125, and a plurality of inversion pipes 122, 124, and 126. The plurality of non-inversion pipes 121, 123, and 125 may generate the plurality of output signals OS<0:n> by non-inverting the plurality of received transmission signals TS<0:n>, and the plurality of inversion pipes 122, 124, and 126 may generate the plurality of output signals OS<0:n> by inverting the plurality of received transmission signals TS<0:n>. The plurality of output signals OS<0:n>, which are outputted from the plurality of non-inversion pipes 121, 123, and 125, may have the substantially same logic level as the plurality of transmission signals TS<0:n>, which the plurality of non-inversion pipes 121, 123, and 125 receives. The plurality of output signals OS<0:n>, which are outputted from the plurality of non-inversion pipes 121, 123, and 125, may have the substantially opposite logic level of the plurality of transmission signals TS<0:n>, which the plurality of inversion pipes 122, 124, and 126 receives. Therefore, the plurality of transmission signals TS<0:n>, which have the different logic levels from the plurality of input signals IS<0:n> by the first output control unit 110, may be decoded into the plurality of output signals OS<0:n>, which have the substantially same logic levels as the plurality of input signals IS<0:n>. The second output control unit 120 may receive the plurality of transmission signals TS<0:n> in response to a plurality of second input control signals PIN2<0:5>, and may output the plurality of output signals OS<0:n> in response to a plurality of second output control signals POUT2<0:5>. Each of the plurality of non-inversion pipes 121, 123, and 125 and the plurality of inversion pipes 122, 124, and 126 may sequentially and alternately receive the plurality of transmission signals TS<0:n>. Also, the plurality of non-inversion pipes 121, 123, and 125 and the plurality of inversion pipes 122, 124, and 126 may sequentially and alternately output the plurality of output signals OS<0:n>. For example, each of the non-inversion and inversion pipes 121 to 126 may alternately output each of the plurality of output signals OS<0:n> in response to respective second output control signals POUT2<0:5> to sequentially input the plurality of output signals OS<0:n>.

Referring to FIG. 2, the first output control unit 110 may include first and second non-inversion pipes 111 and 113, and first and second inversion pipes 112 and 114. The first and second non-inversion pipes 111 and 113 and the first and second inversion pipes 112 and 114 may be coupled in parallel to a node to which the input signals IS<0:n> are inputted and a node to which the transmission signals TS<0:n> are outputted, and may operate alternately in response to the plurality of first input control signals PIN1<0:3> and the plurality of first output control signals POUT1<0:3>. The plurality of first input control signals PIN1<0:3> and the plurality of first output control signals POUT1<0:3> may be generated from a single command signal, a single internal command signal or a single predetermined control signal, and may be sequentially enabled at different timing. For example, the first non-inversion pipe 111 may receive the input signal IS<0> among the plurality of input signals IS<0:n>, which is firstly inputted, when a first bit PIN1<0> of the plurality of first input control signals PIN1<0:3> is enabled.

The first inversion pipe 112 may receive the input signal IS<1> among the plurality of input signals IS<0:n>, which is secondly inputted, when a second bit PIN1<1> of the plurality of first input control signals PIN1<0:3> is enabled. The second non-inversion pipe 113 may receive the input signal IS<2> among the plurality of input signals IS<0:n>, which is thirdly inputted, when a third bit PIN1<2> of the plurality of first input control signals PIN1<0:3> is enabled. The second inversion pipe 114 may receive the input signal IS<3> among the plurality of input signals IS<0:n>, which is fourthly inputted, when a fourth bit PIN1<3> of the plurality of first input control signals PIN1<0:3> is enabled. After that, the first non-inversion pipe 111 may receive the input signal IS<4> among the plurality of input signals IS<0:n>, which is fifthly inputted, when the first bit PIN1<0> of the plurality of first input control signals PIN1<0:3> is enabled again. In this way, the first and second non-inversion pipes 111 and 113 and the first and second inversion pipes 112 and 114 may alternately operate and sequentially receive the plurality of input signals IS<0:n> in response to the plurality of first input control signals PIN1<0:3>.

The first non-inversion pipe 111 may non-invert the input signal IS<0> among the plurality of input signals IS<0:n>, which is firstly inputted, and output the transmission signal TS<0> among the plurality of transmission signals TS<0:n>, which is firstly transmitted, when the first bit POUT1<0> of the plurality of first output control signals POUT1<0:3> is enabled. The first inversion pipe 112 may invert the input signal IS<1> among the plurality of input signals IS<0:n>, which is secondly inputted, and output the transmission signal TS<1> among the plurality of transmission signals TS<0:n>, which is secondly transmitted, when the second bit POUT1<1> of the plurality of first output control signals POUT1<0:3> is enabled. The second non-inversion pipe 113 may non-invert the input signal IS<2> among the plurality of input signals IS<0:n>, which is thirdly inputted, and output the transmission signal TS<2> among the plurality of transmission signals TS<0:n>, which is thirdly transmitted, when the third bit POUT1<2> of the plurality of first output control signals POUT1<0:3> is enabled. The second inversion pipe 114 may invert the input signal IS<3> among the plurality of input signals IS<0:n>, which is fourthly inputted, and output the transmission signal TS<3> among the plurality of transmission signals TS<0:n>, which is fourthly transmitted, when the fourth bit POUT1<3> of the plurality of first output control signals POUT1<0:3> is enabled. After that, the first non-inversion pipe 111 may operate by receiving the input signal IS<4> among the plurality of input signals IS<0:n>, which is fifthly inputted, when the first bit POUT1<0> of the plurality of first output control signals POUT1<0:3> is enabled again. The first non-inversion pipe 111 may non-invert the input signal IS<4> among the plurality of input signals IS<0:n>, which is fifthly inputted, and output the transmission signal TS<4> among the plurality of transmission signals TS<0:n>, which is fifthly transmitted, when the first bit POUT1<0> of the plurality of first output control signals POUT1<0:3> is enabled again. Similarly, the first inversion pipe 112 may operate by receiving the input signal IS<5> among the plurality of input signals IS<0:n>, which is sixthly inputted, when the second bit POUT1<1> of the plurality of first output control signals POUT1<0:3> is enabled again. The second inversion pipe 112 may invert the input signal IS<5> among the plurality of input signals IS<0:n>, which is sixthly inputted, and output the transmission signal TS<5> among the plurality of transmission signals TS<0:n>, which is sixthly transmitted, when the second bit POUT1<1> of the plurality of first output control signals POUT1<0:3> is enabled again. In this way, the first and second non-inversion pipes 111 and 113 and the first and second inversion pipes 112 and 114 may alternately operate and sequentially output the plurality of transmission signals TS<0:n> in response to the plurality of first output control signals POUT1<0:3>.

Referring to FIG. 2, the second output control unit 120 may include third to fifth non-inversion pipes 121, 123, and 125, and third to fifth inversion pipes 122, 124, and 126. The third to fifth non-inversion pipes 121, 123, and 125 and the third to fifth inversion pipes 122, 124, and 126 may be coupled in parallel to a node to which the transmission signals TS<0:n> are inputted and a node to which the output signals OS<0:n> are outputted, and may operate alternately in response to the plurality of second input control signals PIN2<0:5> and the plurality of second output control signals POUT2<0:5>. The plurality of second input control signals PIN2<0:5> and the plurality of second output control signals POUT2<0:5> may be sequentially enabled at different timing. For example, the third non-inversion pipe 121 may receive the transmission signal TS<0> among the plurality of transmission signals TS<0:n>, which is firstly transmitted through the signal transmission line 130, when a first bit PIN2<0> of the plurality of second input control signals PIN2<0:5> is enabled. The third inversion pipe 122 may receive the transmission signal TS<1> among the plurality of transmission signals TS<0:n>, which is secondly transmitted through the signal transmission line 130, when a second bit PIN2<1> of the plurality of second input control signals PIN2<0:5> is enabled. The fourth non-inversion pipe 123 may receive the transmission signal TS<2> among the plurality of transmission signals TS<0:n>, which is thirdly transmitted through the signal transmission line 130, when a third bit PIN2<2> of the plurality of second input control signals PIN2<0:5> is enabled. The fourth inversion pipe 124 may receive the transmission signal TS<3> among the plurality of transmission signals TS<0:n>, which is fourthly transmitted through the signal transmission line 130, when a fourth bit PIN2<3> of the plurality of second input control signals PIN2<0:5> is enabled. The fifth non-inversion pipe 125 may receive the transmission signal TS<4> among the plurality of transmission signals TS<0:n>, which is fifthly transmitted through the signal transmission line 130, when a fifth bit PIN2<4> of the plurality of second input control signals PIN2<0:5> is enabled. The fifth inversion pipe 126 may receive the transmission signal TS<5> among the plurality of transmission signals TS<0:n>, which is sixthly transmitted through the signal transmission line 130, when a sixth bit PIN2<5> of the plurality of second input control signals PIN2<0:5> is enabled. After that, the third non-inversion pipe 121 may receive the transmission signal TS<4> among the plurality of transmission signals TS<0:n>, which is seventhly transmitted through the signal transmission line 130, when the first bit PIN2<0> of the plurality of second input control signals PIN2<0:5> is enabled again. In this way, the third to fifth non-inversion pipes 121, 123, and 125 and the third to fifth inversion pipes 122, 124, and 126 may alternately operate and sequentially receive the plurality of transmission signals TS<0:n> in response to the plurality of second input control signals PIN2<0:5>.

The third non-inversion pipe 121 may non-invert the transmission signal TS<0> among the plurality of transmission signals TS<0:n>, which is firstly transmitted through the signal transmission line 130, and output the non-inverted first transmission signal TS<0> as the first output signal OS<0> when the first bit POUT2<0> of the plurality of second output control signals POUT2<0:5> is enabled. The third inversion pipe 122 may invert the transmission signal TS<1> among the plurality of transmission signals TS<0:n>, which is secondly transmitted through the signal transmission line 130, and output the inverted second transmission signal TS<1> as the second output signal OS<1> when the second bit POUT2<1> of the plurality of second output control signals POUT2<0:5> is enabled. The fourth non-inversion pipe 123 may non-invert the transmission signal TS<2> among the plurality of transmission signals TS<0:n>, which is thirdly transmitted through the signal transmission line 130, and output the non-inverted third transmission signal TS<2> as the third output signal OS<2> when the third bit POUT2<2> of the plurality of second output control signals POUT2<0:5> is enabled. The fourth inversion pipe 124 may invert the transmission signal TS<3> among the plurality of transmission signals TS<0:n>, which is fourthly transmitted through the signal transmission line 130, and output the inverted fourth transmission signal TS<3> as the fourth output signal OS<3> when the fourth bit POUT2<3> of the plurality of second output control signals POUT2<0:5> is enabled. The fifth non-inversion pipe 125 may non-invert the transmission signal TS<4> among the plurality of transmission signals TS<0:n>, which is fifthly transmitted through the signal transmission line 130, and output the non-inverted fifth transmission signal TS<4> as the fifth output signal OS<4> when the fifth bit POUT2<4> of the plurality of second output control signals POUT2<0:5> is enabled. The fifth inversion pipe 126 may invert the transmission signal TS<5> among the plurality of transmission signals TS<0:n>, which is sixthly transmitted through the signal transmission line 130, and output the inverted sixth transmission signal TS<5> as the sixth output signal OS<5> when the sixth bit POUT2<5> of the plurality of second output control signals POUT2<0:5> is enabled. After that, the third non-inversion pipe 121 may operate by receiving the transmission signal TS<6> among the plurality of transmission signals TS<0:n>, which is seventhly inputted, when the first bit POUT2<0> of the plurality of second output control signals POUT2<0:5> is enabled again. The third non-inversion pipe 121 may non-invert the transmission signal TS<6> among the plurality of transmission signals TS<0:n>, which is seventhly transmitted through the signal transmission line 130, and output the non-inverted seventh transmission signal TS<6> as the output signal OS<6> when the first bit POUT2<0> of the plurality of second output control signals POUT2<0:5> is enabled again. Similarly, the third inversion pipe 122 may operate by receiving the transmission signal TS<7> among the plurality of transmission signals TS<0:n>, which is eighthly inputted, when the second bit POUT2<1> of the plurality of second output control signals POUT2<0:5> is enabled again. The third inversion pipe 122 may invert the transmission signal TS<7> among the plurality of transmission signals TS<0:n>, which is eighthly transmitted through the signal transmission line 130, and output the inverted eighth transmission signal TS<7> as the eighth output signal OS<7> when the second bit POUT2<1> of the plurality of second output control signals POUT2<0:5> is enabled again. In this way, the third to fifth non-inversion pipes 121, 123, and 125 and the third to fifth inversion pipes 122, 124, and 126 may alternately operate and sequentially output the plurality of output signals OS<0:n> in response to the plurality of second output control signals POUT2<0:5>.

Even though FIG. 2 gives an example that the first output control unit 110 includes two non-inversion pipes and two inversion pipes, the number of the plurality of non-inversion pipes and the number of the plurality of inversion pipes included in the first output control unit 110 may vary. Even though FIG. 2 gives an example that the second output control unit 120 includes three non-inversion pipes and three inversion pipes, the number of the plurality of non-inversion pipes and the number of the plurality of inversion pipes included in the second output control unit 120 may vary. Further, even though FIG. 2 gives an example that the number of the plurality of inversion pipes and the plurality of non-inversion pipes included in the first output control unit 110 is not the same as the number of the plurality of inversion pipes and the plurality of non-inversion pipes included in the second output control unit 120, the number of the plurality of inversion pipes and the plurality of non-inversion pipes included in the first output control unit 110 may be the same as the number of the plurality of inversion pipes and the plurality of non-inversion pipes included in the second output control unit 120.

In an embodiment of the present disclosure, the first output control unit 110 may include the same number of the non-inversion pipes as the inversion pipes, and the second output control unit 120 may include the same number of the non-inversion pipes as the inversion pipes. Also, the plurality of non-inversion pipes and the plurality of inversion pipes included in the first output control unit 110 may operate in the same order as the plurality of non-inversion pipes and the plurality of inversion pipes included in the second output control unit 120. For example, if the first output control unit 110 alternately operate in the sequence (non-inversion pipe, inversion pipe, non-inversion pipe, inversion pipe, . . . ), the second output control unit 120 alternately operate in the sequence (non-inversion pipe, inversion pipe, non-inversion pipe, inversion pipe, . . . ). If the first output control unit 110 alternately operate in the sequence (inversion pipe, non-inversion pipe, inversion pipe, non-inversion pipe, . . . ), the second output control unit 120 alternately operate in the sequence (inversion pipe, non-inversion pipe, inversion pipe, non-inversion pipe, . . . ).

In an embodiment of the present disclosure, where the number of the non-inversion pipes is different from the number of the inversion pipes in the first output control unit 110, and the number of the non-inversion pipes is different from the number of the inversion pipes in the second output control unit 120, the plurality of non-inversion pipes and the plurality of inversion pipes included in the first output control unit 110 may operate in the same order as the plurality of non-inversion pipes and the plurality of inversion pipes included in the second output control unit 120.

For example, when the first output control unit 110 includes two inversion pipes and one non-inversion pipe and alternately operate in the sequence (inversion pipe, non-inversion pipe, inversion pipe), the second output control unit 120 may include two inversion pipes and one non-inversion pipe or may include four inversion pipes and two non-inversion pipes. When the second output control unit 120 includes four inversion pipes and two non-inversion pipes, the second output control unit 120 may alternately operate in the sequence (inversion pipe, non-inversion pipe, inversion pipe, inversion pipe, non-inversion pipe, inversion pipe). In summary, the plurality of transmission signals TS<0:n>, which are generated by non-inverting the plurality of input signals IS<0:n> through the plurality of non-inversion pipes included in the first output control unit 110, may be non-inverted and outputted as the plurality of output signals OS<0:n> through the plurality of non-inversion pipes included in the second output control unit 120. Also, the plurality of transmission signals TS<0:n>, which are generated by inverting the plurality of input signals IS<0:n> through the plurality of inversion pipes included in the first output control unit 110, may be inverted and outputted as the plurality of output signals OS<0:n> through the plurality of inversion pipes included in the second output control unit 120.

Figure 3:
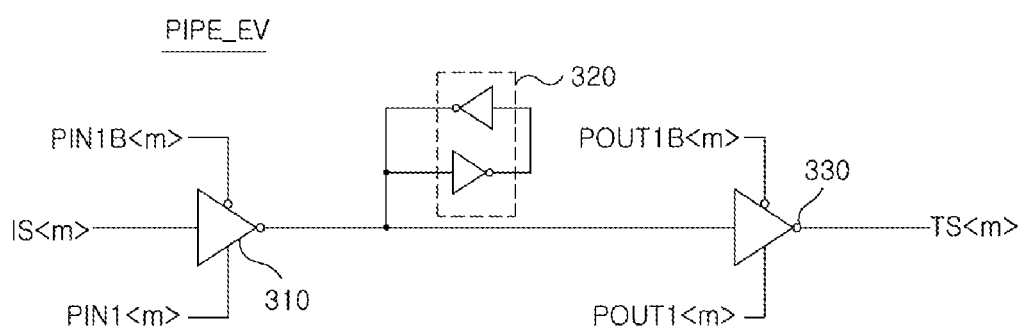
FIG. 3 is a circuit diagram illustrating a non-inversion pipes shown in FIG. 2.

FIG. 3 is a circuit diagram illustrating an example of the non-inversion pipes PIPE_EV of the first output control unit 110 shown in FIG. 2. Each of the first and second non-inversion pipes 111 and 113 of the first output control unit 110 and the third to fifth non-inversion pipes 121, 123, and 125 of the second output control unit 120 may be the same as the non-inversion pipe PIPE_EV except for the input signals and output signals thereof. The non-inversion pipe PIPE_EV may generate the transmission signal TS<m> from the input signal IS<m> in response to the first input control signal PIN1<m> and the first output control signal POUT1<m> (e.g., m is an integer between 0 and n). The non-inversion pipe PIPE_EV may include a first inversion driver 310, a first latch section 320, and a second inversion driver 330. The inversion driver 310 may invert the input signal IS<m> in response to the corresponding first input control signal PIN1<m> and an inverted signal PIN1B<m> of the first input control signal PIN1<m>. The first latch section 320 may latch an output of the first inversion driver 310. The second inversion driver 330 may invert an output of the first latch section 320 and output the transmission signal TS<m> in response to the corresponding first output control signal POUT1<m> and an inverted signal POUT1B<m> of the first output control signal POUT1<m>. The non-inversion pipe PIPE_EV may output the transmission signal TS<m>, the logic level of which is substantially the same as the input signal IS<m>.

Figure 4:
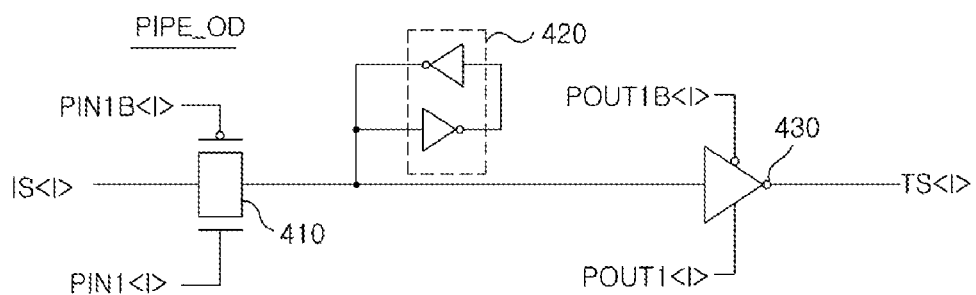
FIG. 4 is a circuit diagram illustrating an inversion pipe shown in FIG. 2.

FIG. 4 is a circuit diagram illustrating an example of the inversion pipe PIPE_OD of the first output control unit 110 shown in FIG. 2. Each of the first and second inversion pipes 112 and 114 of the first output control unit 110 and the third to fifth inversion pipes 122, 124, and 126 of the second output control unit 120 may be the same as the inversion pipe PIPE_OD except for the input signals and output signals thereof. The inversion pipe PIPE_OD may generate the transmission signal TS<l> from the input signal IS<l> in response to the first input control signal PIN1<l> and the first output control signal POUT1<l> (e.g., l is an integer between 0 and n). The inversion pipe PIPE_OD may include a pass gate 410, a second latch section 420, and a third inversion driver 430. The pass gate 410 may pass the input signal IS<l> in response to the corresponding first input control signal PIN1<l> and an inverted signal PIN1B<l> of the first input control signal PIN1<l>. The second latch section 420 may latch an output of the pass gate 410. The third inversion driver 430 may invert an output of the second latch section 420 and output the transmission signal TS<l> in response to the corresponding first output control signal POUT1<l> and an inverted signal POUT1B<l> of the first output control signal POUT1<l>. The inversion pipe PIPE_OD may output the transmission signal TS<l>, the logic level of which is substantially opposite to the input signal IS<l>.

[Table 1]

TABLE 1

| A | B | C |
|---|---|---|
| LLLL | LLLL | LLLL |
| Small | Small | Small |
| Current Consumption | Current Consumption | Current Consumption |
| LHLH | LHLH | LHLH |
| Large | Large | Large |
| Current Consumption | Current Consumption | Current Consumption |
| LLHH | LLHH | LLHH |
| Middle | Middle | Middle |
| Current Consumption | Current Consumption | Current Consumption |
| HLHL | HLHL | HLHL |
| Large | Large | Large |
| Current Consumption | Current Consumption | Current Consumption |

[Table 2]

TABLE 2

| A (IS<0:n>) | B (TS<0:n>) | C (OS<0:n>) |
|---|---|---|
| LLLL | LHLH | LLLL |
| Small | Large | Small |
| Current Consumption | Current Consumption | Current Consumption |
| LHLH | LLLL | LHLH |
| Large | Small | Large |
| Current Consumption | Current Consumption | Current Consumption |
| LLHH | LHHL | LLHH |
| Middle | Middle | Middle |
| Current Consumption | Current Consumption | Current Consumption |
| HLHL | HHHH | HLHL |
| Large | Small | Large |
| Current Consumption | Current Consumption | Current Consumption |

Figure 1:
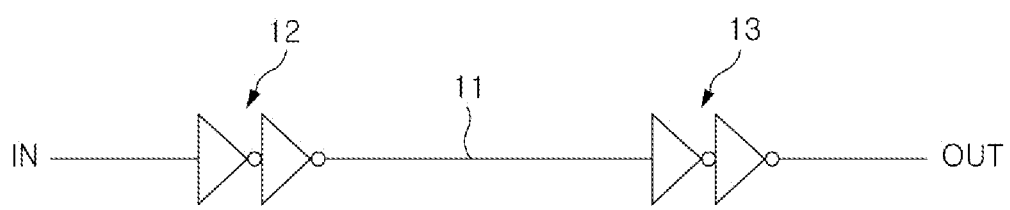
FIG. 1 is a circuit diagram illustrating a known signal transmission circuit.

Table 1 shows an operation and current consumption of the data transmission circuit 10 shown in FIG. 1. Table 2 shows an operation and current consumption of the semiconductor apparatus 1 in accordance with an embodiment of the present disclosure. Referring to FIG. 1, the signal transmission line 11 has three portions, which are an input node of the first repeater 12 ("A"), a portion of the signal transmission line between the first and second repeaters 11 and 12 ("B"), and an output node of the second repeater ("C"). Referring to the first row of Table 1, when the input signal IN is inputted with sequential logic levels of "L", "L", "L", and "L", the signal being transmitted through the signal transmission line portions A, B, and C does not toggle, and the current consumption may be low. Referring to the second row of Table 1, when the input signal IN is inputted with sequential logic levels of "L", "H", "L", and "H", the signal being transmitted through the signal transmission line portions A, B, and C does toggle at each portion of the signal transmission line 11, and the current consumption may be high and the peak current may occur. Referring to the third row of Table 1, when the input signal IN is inputted with sequential logic levels of "L", "L", "H", and "H", the current consumption at each portion of the signal transmission line 11 may be in somewhere in between the above cases. Referring to the fourth row of Table 1, when the input signal IN is inputted with sequential logic levels of "H", "L", "H", and "L", the signal being transmitted through the signal transmission line portions A, B, and C does toggle at each portion of the signal transmission line 11 and the current consumption may be high, and the peak current may occur.

Referring to FIG. 2, there are three portions of the signal transmission line, which are an input node of the first output control unit 110 ("A"), a portion of the signal transmission line between the first and second output control units 110 and 120 ("B"), and an output node of the second output control unit 120 ("C"). The logic level of the signal transmission line portion A may be the same as the logic levels of the input signals IS<0:n>. The logic level of the signal transmission line portion B may be the same as the logic levels of the transmission signals TS<0:n>. The logic level of the signal transmission line portion C may be the same as the logic levels of the output signals OS<0:n>. Referring to the first row of Table 2, when the plurality of input signals IS<0:n> are inputted with sequential logic levels of "L", "L", "L", and "L", the current consumption at the signal transmission line portion A may be low. The first output control unit 110 may encode the plurality of input signals IS<0:n> having the logic levels of "L", "L", "L", and "L" to the plurality of transmission signals TS<0:n> having the logic levels of "L", "H", "L", and "H", which are to be transmitted through the signal transmission line 130. Here, the current consumption at the signal transmission line portion B may be high. When the plurality of transmission signals TS<0:n> are inputted to the second output control unit 120, the plurality of transmission signals TS<0:n> may be decoded to the plurality of output signals OS<0:n> having the logic levels of "L", "L", "L", and "L" and the current consumption at the signal transmission line portion C may be low. Referring to the second row of Table 2, when the plurality of input signals IS<0:n> are inputted with sequential logic levels of "L", "H", "L", and "H", the plurality of transmission signals TS<0:n> may have the logic levels of "L", "L", "L", and "L" and the plurality of output signals OS<0:n> may have the logic levels of "L", "H", "L", and "H". Therefore, the current consumption at each of the signal transmission line portions A and C may be hign, whereas the current consumption at the signal transmission line portion B may be low. Referring to the third row of Table 2, when the plurality of input signals IS<0:n> are inputted with sequential logic levels of "L", "L", "H", and "H", the plurality of transmission signals TS<0:n> may have the logic levels of "L", "H", "H", and "L" and the plurality of output signals OS<0:n> may have the logic levels of "L", "L", "H", and "H". Therefore, the current consumption at each of the signal transmission line portions A, B, and C may be in between high and low. Referring to the fourth row of Table 2, when the plurality of input signals IS<0:n> are inputted with sequential logic levels of "H", "L", "H", and "L", the plurality of transmission signals TS<0:n> may have the logic levels of "H", "H", "H", and "H" and the plurality of output signals OS<0:n> may have the logic levels of "H", "L", "H", and "L". Therefore, the current consumption at each of the signal transmission line portions A and C may be hign, whereas the current consumption at the signal transmission line portion B may be low.

As can be seen from the second and third rows of Table 1, when a continuously toggling signal is transmitted through the signal transmission circuit 10, a large current may flow through the signal transmission line portions A, B, and C, and the peak current may occur. As can be seen from Table 2, the semiconductor apparatus 1 in accordance with an embodiment of the present disclosure may reduce the current consumption at the signal transmission line. Therefore, the semiconductor apparatus 1 in accordance with an embodiment of the present disclosure may reduce the peak current.

Figure 5:
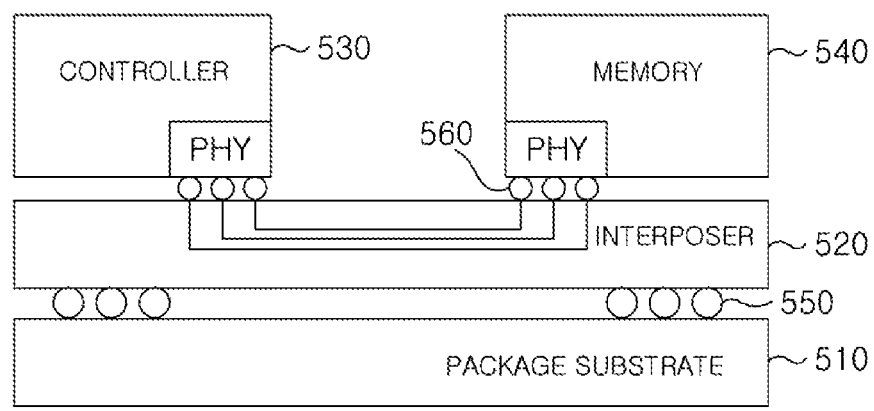
FIG. 5 is a schematic diagram illustrating a system in accordance with an embodiment of the present disclosure.

FIG. 5 is a schematic diagram illustrating a system 2 in accordance with an embodiment of the present disclosure. Referring to FIG. 5, the system 2 may include a package substrate 510, an interposer substrate 520, a controller 530 and a memory 540. The interposer substrate 520 stacked on the package substrate 510 may be electrically connected to the package substrate 510 through electrically coupling means 550 such as a bump ball, a ball grid array, a C4 bump, and so forth. The package substrate 510 and the interposer substrate 520 may have signal paths. Although not illustrated, the package substrate 510 may include a package ball, and the system 2 may be electrically connected to an external device through the package ball.

The controller 530 and the memory 540 stacked on the interposer substrate 520 may be electrically connected to the interposer substrate 520 through a micro bump 560. The controller 530 may communicate with the memory 540 through the signal paths of the interposer substrate 520. Each of the controller 530 and the memory 540 may include the physical layer PHY which is a communication interface for data communication. The elements of the system 2 may be packaged in a single package, or in various forms such as a system on chip (SOC), a system in package (SIP), a multi-chip package, a flip-chip package, and so forth.

The controller 530 may be a master device for controlling the memory 540. The controller 530 may be one or more of a Central Processing Unit (CPU), a Graphic Processing Unit (GPU), a Digital Signal Processor (DSP), an application processor (AP), a controller chip, and a memory controller chip.

The memory 540 may be a slave device to be controlled by the controller 530. The memory 540 may be a volatile memory apparatus like a dynamic random access memory (DRAM). Also, the memory 540 may include one or more of non-volatile memory apparatuses including a flash memory device, a Phase Change Random Access Memory (PCRAM), a Resistive Random Access Memory (ReRAM), a Ferroelectric Random Access Memory (FeRAM), a Magnetic Random Access Memory (MRAM) and a Spin Transfer Torque Random Access Memory (STTRAM). Further, the memory 540 may include the volatile and non-volatile memory apparatuses. As an example, the memory 540 may be a stack-type semiconductor apparatus including a plurality of chips.

Figure 6:
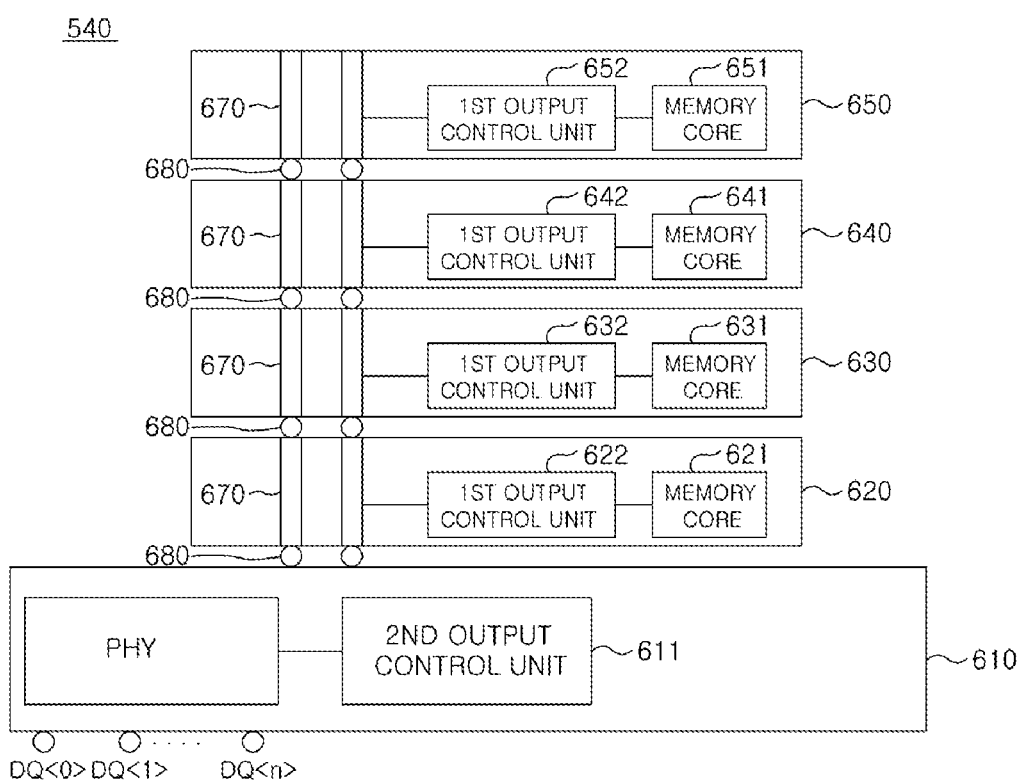
FIG. 6 is a schematic diagram illustrating a memory shown in FIG. 5.

FIG. 6 is a schematic diagram illustrating the memory 540 shown in FIG. 5. Referring to FIG. 6, the memory 540 may include a base die 610 and a plurality of dies 620, 630, 640, and 650. The plurality of dies 620, 630, 640, and 650 may be disposed over the base die 610. For example, the plurality of dies 620, 630, 640, and 650 may be vertically stacked over the base die 610 ("stacked dies"). Each of the plurality of stacked dies 620, 630, 640, and 650 may include a through-via 670 formed therein, and may be electrically connected to the base die 610 and the other stacked dies 620, 630, 640, and 650 through a micro bump 680 and the through-via 670. The plurality of stacked dies 620, 630, 640, and 650 may include memory cores 621, 531, 641, and 651 for storing data, respectively.

Each of the plurality of stacked dies 620, 630, 640, and 650 may include a first output control units 622, 632, 642, and 652, and the base die 610 may include a second output control unit 611 and the physical layer PHY. The first output control units 622, 632, 642, and 652 may latch data outputted from the memory cores 621, 631, 641, and 651 of the stacked dies 620, 630, 640, and 650, and may transmit the latched data to the base die 610, respectively. The first output control units 622, 632, 642, and 652 may allow data, which are outputted from the memory cores 621, 631, 641, and 651, to be outputted to the base die 610 at predetermined timing by using a pipeline. The first output control units 622, 632, 642, and 652 may allow the plurality of stacked dies 620, 630, 640, and 650, which have different skew from one another, to operate at high speed under a high latency condition. Each of the first output control units 622, 632, 642, and 652 may include the first output control unit 110 of FIG. 2. Data outputted from the first output control units 622, 632, 642, and 652 may be transmitted to the second output control unit 611 through the through-via 670. The second output control unit 611 may store the data transmitted through the through-via 670, and may output the stored data to the physical layer PHY. The second output control unit 611 may allow data, which are outputted from the plurality of stacked dies 620, 630, 640, and 650, to be outputted to the physical layer PHY and the controller 530 at predetermined timing by using a pipeline. The second output control unit 611 may include the second output control unit 120 of FIG. 2. The physical layer PHY may receive data outputted from the second output control unit 611, and may output the received data to the controller 530 as data DQ<0:n>.

Figure 7:
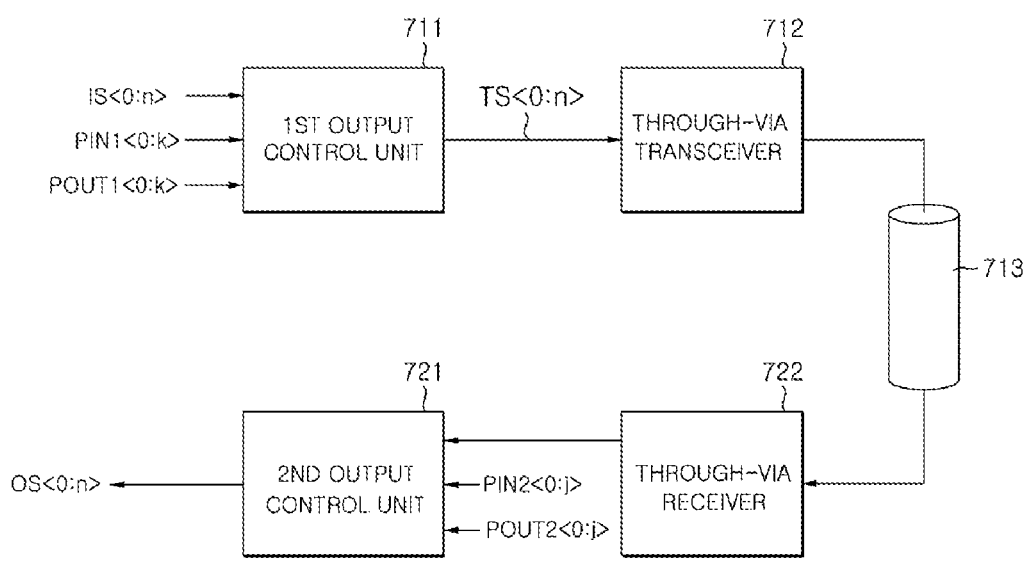
FIG. 7 is a schematic diagram illustrating the configuration of a base die and one of a plurality of stacked dies shown in FIG. 6.

FIG. 7 is a schematic diagram illustrating the configuration of the base die 610 and one of the plurality of stacked dies 620, 630, 640, and 650 shown in FIG. 6. Each of the plurality of stacked dies 620, 630, 640, and 650 may include the first output control unit 711, a through-via transceiver 712, and the through-via 713. The through-via 713 may be formed inside the stacked die, and may be electrically coupled to elements of the base die 610 through a bump (not illustrated). The first output control unit 711 may receive the input data IS<0:n>, which is outputted from the memory core. The first output control unit 711 may receive the input data IS<0:n> in response to a first input control signal PIN1<0:k>, and may output the received data to the through-via transceiver 712 as a transmission data TS<0:n> in response to a first output control signal POUT1<0:k> (e.g., k is an integer equal to or greater than two). The through-via transceiver 712 may amplify and output the transmission data TS<0:n>, which is outputted from the first output control unit 711, to the through-via 713.

The base die 610 may include a through-via receiver 722 and the output control unit 721. The through-via receiver 722 may receive the transmission data TS<0:n>, which is transmitted through the through-via 713, amplify it, and output the transmission data TS<0:n>. The second output control unit 721 may receive the transmission data TS<0:n> outputted from the through-via receiver 722. The second output control unit 721 may receive the transmission data TS<0:n> in response to a second input control signal PIN2<0:j>, and may output the received data as an output data OS<0:n> in response to a second output control signal POUT2<0:j> (e.g., j is an integer equal to or greater than two).

The first output control unit 711 may include the first output control unit 110 of FIG. 2, and a signal transmission line portion which includes an input node of the first output control unit 711 may correspond to the signal transmission line portion A of Table 2. The signal transmission line portion including the through-via transceiver 712, the through-via 713, and the through-via receiver 722, through which the transmission data TS<0:n> is transmitted, may correspond to the signal transmission line portion including the transmission load of the signal transmission line 130 described with reference to FIG. 2, and may correspond to the signal transmission line portion B of Table 2. The second output control unit 721 may include the second output control unit 120 described with reference to FIG. 2, and a signal transmission line portion which includes an output node of the second output control unit 721 may correspond to the signal transmission line portion C of Table 2. The first output control unit 711 of the stacked die and the second output control unit 721 of the base die 610 may reduce excessive current consumption at the signal transmission line portions A, B, and C, and thus may reduce the peak current, which occurs during the data transmission.

While certain embodiments have been described above, it will be understood to those skilled in the art that the embodiments described are by way of example only. Accordingly, the semiconductor apparatus and system capable of reducing peak current in transmitting signals should not be limited based on the described embodiments. Rather, the semiconductor apparatus and system capable of reducing peak current in transmitting signals described herein should only be limited in light of the claims that follow when taken in conjunction with the above description and accompanying drawings.

What is claimed is:

1. A semiconductor apparatus comprising:
 a first output control unit comprising a plurality of non-inversion pipes and a plurality of inversion pipes; and
 a second output control unit comprising a plurality of non-inversion pipes and a plurality of inversion pipes,
 wherein the non-inversion pipes of the first output control unit are configured to non-invert input signals and output the non-inverted input signals to a signal transmission line as transmission signals, the inversion pipes of the first output control unit are configured to invert input signals and output the inverted input signal to the signal transmission line as the transmission signals, the non-inversion pipes of the second output control unit are configured to non-invert the transmission signals and output the non-inverted transmission signals, and the inversion pipes of the second output control unit are configured to invert the transmission signal and output the inverted transmission signals.

2. The semiconductor apparatus of claim 1, wherein the plurality of non-inversion pipes and the plurality of inversion pipes included in the first output control unit receive the input signals by sequentially and alternately operating in response to a plurality of first input control signals.

3. The semiconductor apparatus of claim 2, wherein the plurality of non-inversion pipes and the plurality of inversion pipes included in the first output control unit output the transmission signals by sequentially and alternately operating in response to a plurality of first output control signals.

4. The semiconductor apparatus of claim 3, wherein each of the plurality of non-inversion pipes included in the first output control unit comprises:
 a first inversion driver configured to invert the input signal in response to corresponding one of the plurality of first input control signals;
 a first latch section configured to latch an output of the first inversion driver; and
 a second inversion driver configured to output the transmission signal by inverting an output of the first latch section in response to corresponding one of the plurality of first output control signals.

5. The semiconductor apparatus of claim 4, wherein each of the plurality of inversion pipes included in the first output control unit comprises:
 a pass gate configured to pass the input signal in response to corresponding one of the plurality of first input control signals;
 a second latch section configured to latch an output of the pass gate; and
 a third inversion driver configured to output the transmission signal by inverting an output of the second latch section in response to corresponding one of the plurality of first output control signals.

6. The semiconductor apparatus of claim 1, wherein the plurality of non-inversion pipes and the plurality of inversion pipes included in the second output control unit receive the transmission signal by sequentially and alternately operating in response to a plurality of second output control signals.

7. The semiconductor apparatus of claim 6, wherein the plurality of non-inversion pipes and the plurality of inversion pipes included in the second output control unit output the output signal by sequentially and alternately operating in response to a plurality of second output control signals.

8. The semiconductor apparatus of claim 7, wherein each of the plurality of non-inversion pipes included in the second output control unit comprises:
 a first inversion driver configured to invert the transmission signal in response to corresponding one of the plurality of second input control signals;
 a first latch section configured to latch an output of the first inversion driver; and
 a second inversion driver configured to output the output signal by inverting an output of the first latch section in response to corresponding one of the plurality of second output control signals.

9. The semiconductor apparatus of claim 8, wherein each of the plurality of inversion pipes included in the second output control unit comprises:
 a pass gate configured to pass the transmission signal in response to corresponding one of the plurality of second input control signals;
 a second latch section configured to latch an output of the pass gate; and
 a third inversion driver configured to output the output signal by inverting an output of the second latch section in response to corresponding one of the plurality of second output control signals.

10. The semiconductor apparatus of claim 1, wherein numbers of the plurality of non-inversion pipes and the plurality of inversion pipes included in the first output control unit are the same as each other, and numbers of the plurality of non-inversion pipes and the plurality of inversion pipes included in the second output control unit are the same as each other.

11. The semiconductor apparatus of claim 1, wherein operation sequences of the plurality of non-inversion pipes and the plurality of inversion pipes included in the first output control unit and the plurality of non-inversion pipes and the plurality of inversion pipes included in the second output control unit are the same as each other.

12. The semiconductor apparatus of claim 1,
 wherein the transmission signal, which is generated by non-inverting the input signal through the plurality of non-inversion pipes included in the first output control unit, is non-inverted at the plurality of non-inversion pipes included in the second output control unit and outputted as the output signal, and
 wherein the transmission signal, which is generated by inverting the input signal through the plurality of inversion pipes included in the first output control unit, is inverted at the plurality of inversion pipes included in the second output control unit and outputted as the output signal.

13. A system comprising:
 a plurality of dies each including a first output control unit configured to output transmission data by aligning data outputted from a memory core; and
 a base die including a second output control unit configured to receive the transmission data through a through-via, and to output an output data by aligning the transmission data,
 wherein the first output control unit comprises a plurality of non-inversion pipes and a plurality of inversion pipes, and the second output control unit comprises a plurality of non-inversion pipes and a plurality of inversion pipes, and
 wherein the non-inversion pipes of the first output control unit are configured to non-invert and output a part of data, which is outputted from the memory core, to a signal transmission line, the inversion pipes of the first output control unit are configured to invert and output the other part of data, which is outputted from the memory core, to the signal transmission line, the non-inversion pipes of the second output control unit are configured to non-invert and output a part of the transmission data, and the inversion pipes of the second output control unit are configured to invert and output the other part of the transmission data.

14. The system of claim 13, wherein the plurality of non-inversion pipes and the plurality of inversion pipes included in the first output control unit receive the data outputted from the memory core by sequentially and alternately operating in response to a plurality of first input control signals.

15. The system of claim 14, wherein the plurality of non-inversion pipes and the plurality of inversion pipes included in the first output control unit output the transmission data by sequentially and alternately operating in response to a plurality of first output control signals.

16. The system of claim 13, wherein the plurality of non-inversion pipes and the plurality of inversion pipes included in the second output control unit receive the transmission data by sequentially and alternately operating in response to a plurality of second output control signals.

17. The system of claim 16, wherein the plurality of non-inversion pipes and the plurality of inversion pipes included in the second output control unit output the output data by sequentially and alternately operating in response to a plurality of second output control signals.

18. The system of claim 13, wherein numbers of the plurality of non-inversion pipes and the plurality of inversion pipes included in the first output control unit are the same as each other, and numbers of the plurality of non-inversion pipes and the plurality of inversion pipes included in the second output control unit are the same as each other.

19. The system of claim 13, wherein operation sequences of the plurality of non-inversion pipes and the plurality of inversion pipes included in the first output control unit and the plurality of non-inversion pipes and the plurality of inversion pipes included in the second output control unit are the same as each other.

20. The system of claim 13,
wherein the part of the transmission data, which is generated by the non-inversion through the plurality of non-inversion pipes included in the first output control unit, is non-inverted at the plurality of non-inversion pipes included in the second output control unit and outputted as the output signal, and
wherein the other part of the transmission data, which is generated by the inversion through the plurality of inversion pipes included in the first output control unit, is inverted at the plurality of inversion pipes included in the second output control unit and outputted as the output signal.

* * * * *